United States Patent [19]

Jones et al.

[11] Patent Number: 5,422,848
[45] Date of Patent: Jun. 6, 1995

[54] ECL-TO-CMOS BUFFER HAVING A SINGLE-SIDED DELAY

[75] Inventors: Kenneth W. Jones; Ray Chang, both of Austin, Tex.

[73] Assignee: Motorola Inc., Schaumburg, Ill.

[21] Appl. No.: 909,484

[22] Filed: Jul. 6, 1992

[51] Int. Cl.⁶ .................. G11C 7/00; H03K 19/092
[52] U.S. Cl. ................... 365/189.05; 365/230.08; 365/194; 365/189.08; 365/177; 365/190; 365/255.6; 326/73; 326/109
[58] Field of Search ............. 365/189.05, 194, 189.08, 365/230.08, 177, 189.01, 190, 225.6; 307/475, 455, 451, 446

[56] References Cited

U.S. PATENT DOCUMENTS

| | | | |
|---|---|---|---|
| 4,645,951 | 2/1987 | Uragami | 307/446 |
| 4,985,865 | 1/1991 | Houston | 365/194 |
| 4,996,671 | 2/1991 | Suzuki et al. | 365/203 |
| 5,022,011 | 6/1991 | Allan | 365/233 |
| 5,216,298 | 6/1993 | Ohba et al. | 307/475 |
| 5,313,422 | 5/1994 | Houston | 365/194 |

OTHER PUBLICATIONS

Nobuo Tamba et al., "An 8-ns 256K BiCMOS RAM", IEEE Journal of Solid-State Circuits, vol. 24, No. 4, Aug. 1989, FIG. 8, p. 1023.

Primary Examiner—Joseph A. Popek
Assistant Examiner—Huan Hoang
Attorney, Agent, or Firm—Daniel D. Hill

[57] ABSTRACT

An ECL-to-CMOS buffer having a single-sided delay comprises an ECL logic gate, a level converter, a plurality of series connected inverters, and a NOR gate. The ECL logic gate receives an ECL level input signal, and provides complementary intermediate level logic signals. The level converter receives the intermediate level logic signals and provides a CMOS level output signal. The NOR gate receives the CMOS level output signal, via the series connected inverters, at an input terminal after a predetermined delay. One of the intermediate level logic signals is also received by the NOR gate at a second input terminal. The CMOS level output signal is delayed for a predetermined time in a low-to-high transition, with no unwanted delay in a high-to-low transition.

14 Claims, 7 Drawing Sheets

ECL-TO-CMOS BUFFER HAVING A SINGLE-SIDED DELAY

CROSS-REFERENCE TO RELATED APPLICATION

A related application is entitled "Memory Having A Write Enable Controlled Word Line", by Mark D. Bader et al., now U.S. Pat. No. 5,268,863, assigned to the assignee hereof, and filed concurrently herewith.

1. Field of the Invention

This invention relates generally to ECL-to-CMOS buffers and more particularly, to an ECL-to-CMOS buffer having a single-sided delay.

2. Background of the Invention

There are several integrated circuit logic families available from which to chose when designing an integrated circuit memory. ECL (emitter-coupled logic) is a type of integrated circuit logic which uses bipolar transistors. CMOS (complementary metal-oxide-semiconductor) is another type of integrated circuit logic, however CMOS uses complementary MOSFET (metal-oxide-semiconductor field-effect transistor) transistors. ECL circuits have the advantage of high speed because the logic swing between high and low logic states may be less than one volt, but they consume a large amount of power. CMOS logic circuits have the advantage of low power dissipation, but they are slower because the logic states may swing the full rail of the power supply voltage. Therefore, combining ECL and CMOS on an integrated circuit provides the important advantages of high speed and low power consumption. ECL is used in those circuit portions requiring higher processing speeds. CMOS is used to reduce power consumption in those circuit portions that are less time-critical. Converter, or translator circuitry must be provided internally on the integrated circuit for transitioning from ECL to CMOS logic levels.

It is often desirable to have an ECL-to-CMOS buffer with a single-sided delay. Ideally, the output of a buffer with a single-sided delay transitions from a first logic state to second logic state with a predetermined delay, and transitions from the second logic state back to the first logic state without a delay. But in practice, there may be an unwanted delay in the transition from the second logic state to the first logic state that causes an undesirable speed penalty.

FIG. 1 illustrates a block diagram of a prior art ECL-to-CMOS converter having single-sided delay 10. An ECL logic signal labeled "$ECL_{IN}$" is provided to ECL-to-CMOS input buffer 11 and in response, a CMOS level output signal labeled "$CMOS_{OUT}$" is provided. CMOS level output signal $CMOS_{OUT}$ is provided to one input of two input CMOS NAND gate 13, and through inverter chain 12 to the other input of CMOS NAND gate 13. CMOS NAND gate 13 provides a logical NAND signal to inverter 14, which provides a CMOS level output signal labeled "OUT".

FIG. 2 illustrates a timing diagram of the some of the signals at selected points of the prior art ECL-to-CMOS of FIG. 1. When ECL logic signal $ECL_{IN}$ transitions from a logic low to a logic high, CMOS level output signal $CMOS_{OUT}$ transitions to a logic high, and CMOS level output signal OUT transitions after a predetermined delay provided by inverter chain 12. The predetermined delay is labeled "wanted delay". When ECL logic signal $ECL_{IN}$ transitions from a logic high to a logic low, CMOS level output signal $CMOS_{OUT}$ becomes a logic low and then CMOS level output signal OUT becomes a logic low. There is an delay labeled "unwanted delay" before signal OUT returns to a logic low. This unwanted delay may introduce a significant undesirable speed penalty in the integrated circuit memory. The speed penalty is introduced because the single-sided delay is introduced in that part of the circuitry that uses full-rail CMOS levels after ECL-to-CMOS input buffer 11. Also, the speed is further reduced by at least one stage because both the low-to-high and the high-to-low logic transitions must go through ECL-to-CMOS input buffer 11.

SUMMARY OF THE INVENTION

Accordingly, there is provided, in one form, an ECL-to-CMOS buffer having a single-sided delay comprised of an ECL logic gate, a level converter, a delay circuit, and a logic gate. The ECL logic gate receives an ECL level input signal, and in response provides first and second intermediate level logic signals. The level converter receives the first and second intermediate level logic signals and provides a first CMOS level signal. The delay circuit has an input terminal for receiving the first CMOS level output signal and an output terminal for providing a second CMOS level signal a predetermined delay after receiving the first CMOS level output signal. The logic gate receives the second intermediate level logic signal and the second CMOS level logic signal and provides a CMOS level output signal. These and other features and advantages will be more clearly understood from the following detailed description taken in conjunction with the accompanying drawings.

DESCRIPTION OF A PREFERRED EMBODIMENT

Figure 3:
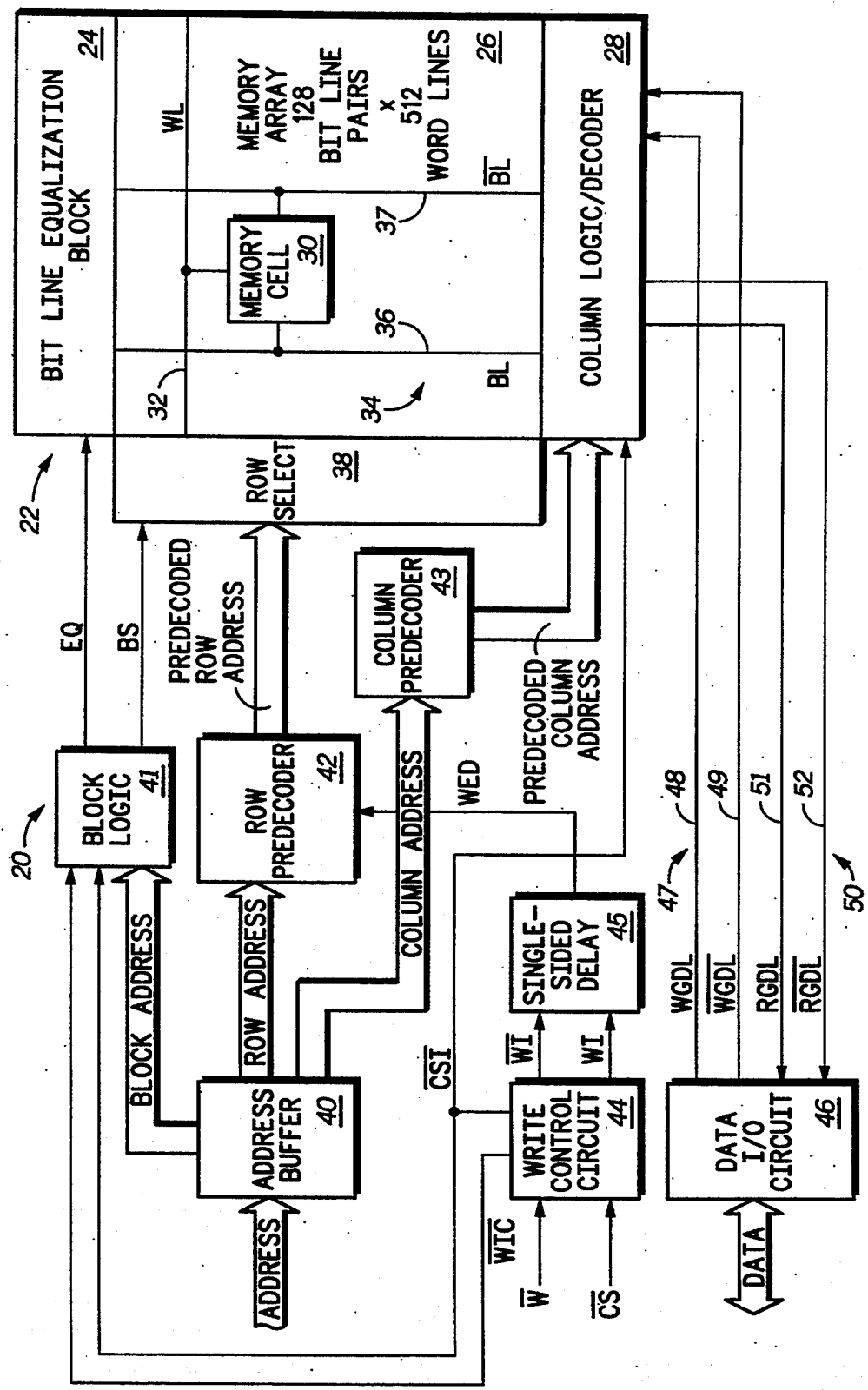
FIG. 3 illustrates in block diagram form an integrated circuit memory in accordance with the present invention.

FIG. 3 illustrates in block diagram form memory 20 in accordance with the present invention. Memory 20 includes memory block 22, row select circuitry 38, address buffer 40, row predecoder 42, block logic 41, column predecoder 43, write control circuit 44, single-sided delay circuit 45, data I/O circuitry 46, write global data lines 47 and read global data lines 50. Memory block 22 includes bit line equalization block 24, memory array 26, column logic/decoder 28, memory cell 30, word line 32, and bit line pair 34. Memory block 22 is a representative memory block of memory 20 and there may be other memory blocks present in memory 20. Memory array 26 includes 128 bit line pairs and 512 word lines. Memory cells are located at intersections of word lines and bit line pairs. A representative memory cell 30 is illustrated in FIG. 3 connected to word line 32 and bit line pair 34. Bit line pair 34 includes bit lines 36 and 37. Write global data lines 47 includes a write global data line 48 and a write global data line 49. Read global data lines 50 includes a read global data line 51 and a read global data line 52.

Write control circuit 44 receives an ECL (emitter-coupled logic) level external write enable signal labeled "$\overline{W}$" and an ECL level external chip select signal labeled "$\overline{CS}$". In response, write control circuit 44 provides a core write signal labeled "$\overline{WIC}$", an internal chip select signal labeled "$\overline{CSI}$", and differential internal write signals labeled "WI" and "$\overline{WI}$", respectively. Single-sided delay circuit 45 receives internal write signals WI and $\overline{WI}$ and provides a single-sided delay control signal labeled "WED".

Address buffer 40 receives an address signal labeled "ADDRESS", and provides a buffered differential row address labeled "ROW ADDRESS", a buffered differential block address labeled "BLOCK ADDRESS", and a buffered differential column address labeled "COLUMN ADDRESS". Block logic 41 receives block address signals BLOCK ADDRESS, core write signal $\overline{WIC}$, and internal chip select signal $\overline{CSI}$, and in response provides a bit line equalization signal labeled "EQ" to bit line equalization block 24 and a block select signal labeled "BS" to row select 38. In other embodiments, different numbers of blocks, different sizes of blocks and different word widths could be used. Block logic 41 will provide block select signals and bit line equalization signals to the other memory blocks as well.

Row predecoder 42 receives differential row address signals ROW ADDRESS and single-sided delay control signal WED. In response, row predecoder 42 provides a plurality of predecoded row address signals labeled "PREDECODED ROW ADDRESS" to row select 38. Column predecoder 43 receives differential column address signals COLUMN ADDRESS, and in response provides a plurality of predecoded column address signals labeled "PREDECODED COLUMN ADDRESS" to column logic/decoder 28. The particular address signals received by row predecoder 42 and column predecoder 43 have no special significance and may be different in other embodiments. Also, the amount of decoding performed by the row and column predecoders may be different in other embodiments.

In one embodiment, memory block 22 is one of 64 memory blocks, and the 64 blocks are grouped into four quadrants of 16 blocks each. The other memory blocks are not shown for the purposes of clarity and simplicity. In memory block 22, row select 38 receives block select signal BS and a predecoded row address, and in response selects one of the 512 word lines. Memory cells in memory array 26 are located at intersections of 512 word lines and 128 bit line pairs. Each memory cell is coupled to a word line and a bit line pair. Each bit line pair serves as an input to the memory cells during the write cycle of memory 20 and as an output during the read cycle. A representative memory cell 30 is shown coupled to word line 32, and to bit line pair 34. Bit line equalization block 24 receives equalization signal EQ from block logic 41, and is coupled to each of 128 bit line pairs of memory array 26. Block logic 41 provides block select signals BS to select one of the memory blocks.

Column logic/decoder 28 is coupled to each bit line pair, including representative bit line pair 34, and is coupled to read global data line pair 50 and write global data line pair 47. During a write cycle, data I/O circuit 46 receives single-ended data labeled "DATA", and provides differential data signals labeled "WGDL" and "$\overline{WGDL}$" to write global data lines 48 and 49, respectively. During a read cycle, data I/O circuit 46 receives differential data signals labeled "RGDL" and "$\overline{RGDL}$" to read global data lines 51 and 52, respectively, and provides single-ended data signals DATA. In a preferred embodiment, memory 20 is configured with a word width of X1. However, memory 20 could also be configured with a word width of X2, X4, or X8. The other read global data lines and write global data lines to support other word widths are not shown for ease of illustration.

For a word width of X1, memory 20 receives 22 address signals, A0–A21. Address buffer 40 provides column address signals A0–A3, A8 and A9 block address signals A4–A7, row address signals A10–A16, quad address signals A17 and A18 to select one of the four quadrants, and X1 option address signals A19–A21. Fewer address signals are necessary to configure memory 20 for other word widths.

To read data from memory 20, write control circuit 44 receives external chip select signal $\overline{CS}$ as an ECL logic low (active), and external write enable signal $\overline{W}$ as an ECL logic high (inactive). Note that a bar, or overline, over the signal name indicates that the signal is active at a logic low. In response to receiving internal write signals WI and $\overline{WI}$, single-sided delay circuit 45 provides single-sided delay control signal WED as a logic low during the read cycle. Differential signals WI and $\overline{WI}$ and internal chip select signal $\overline{CSI}$ are buffered from signals $\overline{W}$ and $\overline{CS}$, respectively. Block select signal BS is decoded from block address signals BLOCK ADDRESS and selects memory block 22 of memory 20. Only one memory block can be selected at a time. Row predecoder 42 receives a row address decoded from buffered differential row address signals ROW ADDRESS, and provides a predecoded row address labeled "PREDECODED ROW ADDRESS" to row select 38, to select one of the 512 word lines, of which word line 32 is an example. There are 128 memory cells coupled to each word line. Each memory cell that is coupled to the selected word line provides its output as a differential voltage on a corresponding bit line pair. Predecoded column address signals PREDECODED COLUMN ADDRESS are provided to column logic/decoder 28. For a word width of X1, column logic/decoder 28 selects one bit line pair of the 128 bit line pairs, for example, bit line pair 34. When bit line pair 34 is selected, column logic/decoder 28 then senses and amplifies the relatively small differential voltage provided to bit line pair 34 by memory cell 30 and couples the selected bit line to read global data line pair 50. Read global data line pair 50 is representative of the eight read global data line pairs in memory 20. Data I/O circuit 46 receives a differential signal from read global data line pair 50 corresponding to the differential signal from bit line pair 34, and provides single ended data signal DATA. The differential voltage during a read cycle is approximately 300 millivolts.

During a write cycle, the flow of data is essentially reversed. To write data into memory 20, chip select signal $\overline{CS}$ is a logic low (active), and write enable signal $\overline{W}$ changes state from a logic high to a logic low. Data I/O circuit 46 receives a data bit to be written into memory 20, and provides the data bit as a differential signal on a corresponding write global data line pair 47. Write global data line pair 47 is representative of the eight write global data line pairs in memory 20. Block logic 41 selects the memory block that is to receive the data bit. Column predecoder 43 provides the predecoded column address to column logic/decoder 28 which couples a write global data line pair to a bit line pair. Row predecoder provides a predecoded row address to row select 38 which selects one of 512 word lines. As in the read cycle, memory cells located on an enabled word line provide data to bit line pairs. However, a voltage differential driven on bit line pairs by column logic/decoder 28 is greater than the drive voltage of the memory cell and overwrites a stored bit in the memory cell. The differential voltage driven onto the bit line pairs during the write cycle is approximately 3.0 volts. At the end of a write cycle the differential voltage on the bit line pair must be reduced to a level small enough so that the data is not erroneously written into a memory cell during the following read cycle. Equalization of the bit line pairs is achieved by bit line equalization block 24.

The write cycle ends in response to write enable signal $\overline{W}$ becoming a logic high. The differential voltage on the selected bit line pair must be equalized before the address changes the word line. This time period is specified by the TWHAX specification. The TWHAX time period is illustrated in the timing diagram of FIG. 5. Sometimes, for various reasons, TWHAX is of insufficient duration to allow bit line equalization before the word line changes. If the word line changes before bit line equalization occurs, the data being written during the write cycle may be written into the selected memory cell during the next read cycle, causing a data reliability problem.

Single-sided delay circuit 45 provides single-sided delay control signal WED to row predecoder 42 to prevent the predecoded row address from changing before bit line equalization occurs. The old predecoded row address is latched, and the new predecoded row address is prevented from leaving row predecoder 42 until single-sided delay control signal WED becomes a logic low. In the preferred embodiment, the address is latched in row predecoder 42. In other embodiments, the row address can be latched anywhere between address buffer 40 and row select 38. In determining where to latch the address, the number of address signals in the memory, the current loading on each signal path, and the layout of the integrated circuit memory should be considered. Also, in other embodiments, the column address may be latched instead of the row address.

Figure 7:
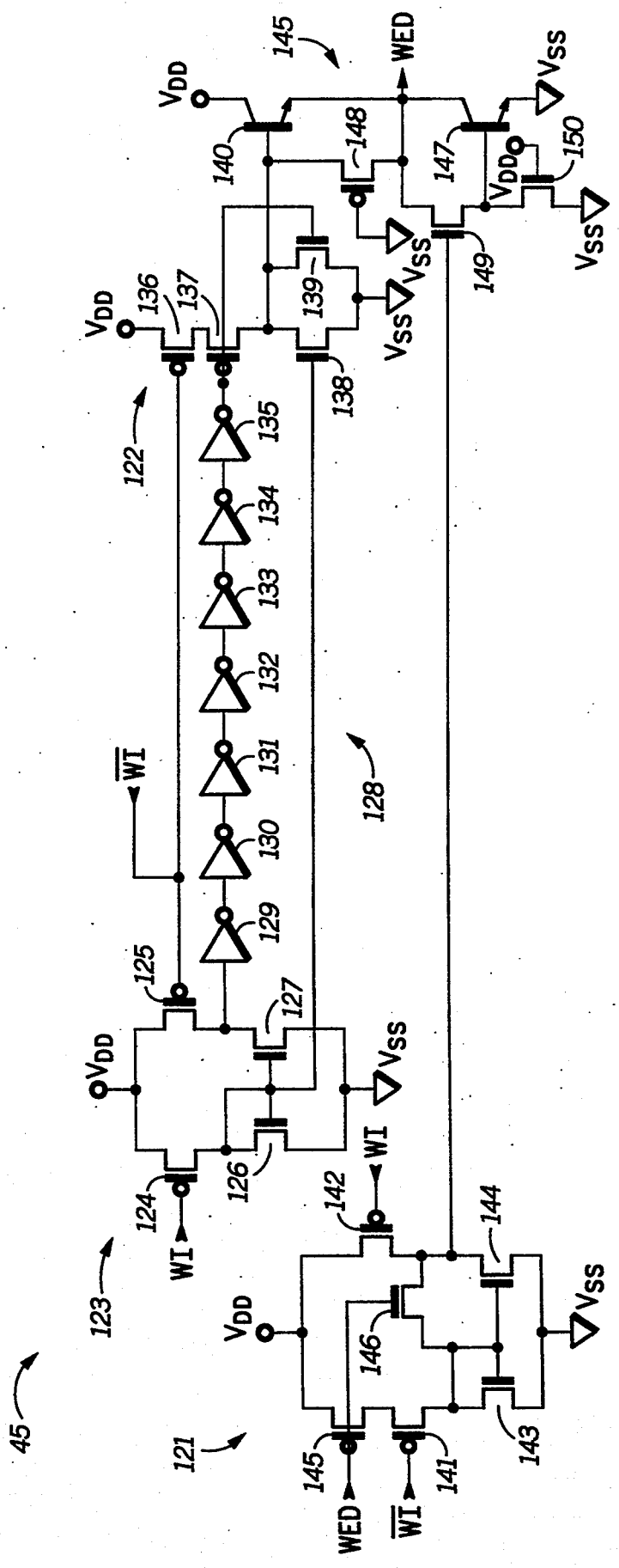
FIG. 7 illustrates in schematic form the single-sided delay circuit of the memory of FIG. 3 in accordance with a preferred embodiment of the present invention.

Single-sided delay control signal WED is active at a logic high. When write enable signal $\overline{W}$ changes from a logic high to a logic low, single-sided delay control signal WED changes from a logic low to a logic high. When write enable signal $\overline{W}$ changes from a logic high to a logic low, single sided delay circuit 45 delays the transition of single-sided delay control signal WED from a logic low to a logic high. Hence the name, single-sided delay. The circuit that provides single-sided delay control signal WED is illustrated in FIG. 7 and will be discussed later. Controlling word line selection with the write enable signal prevents a new address from rippling through before bit line equalization has occurred, thus preventing TWHAX failure.

Figure 4:
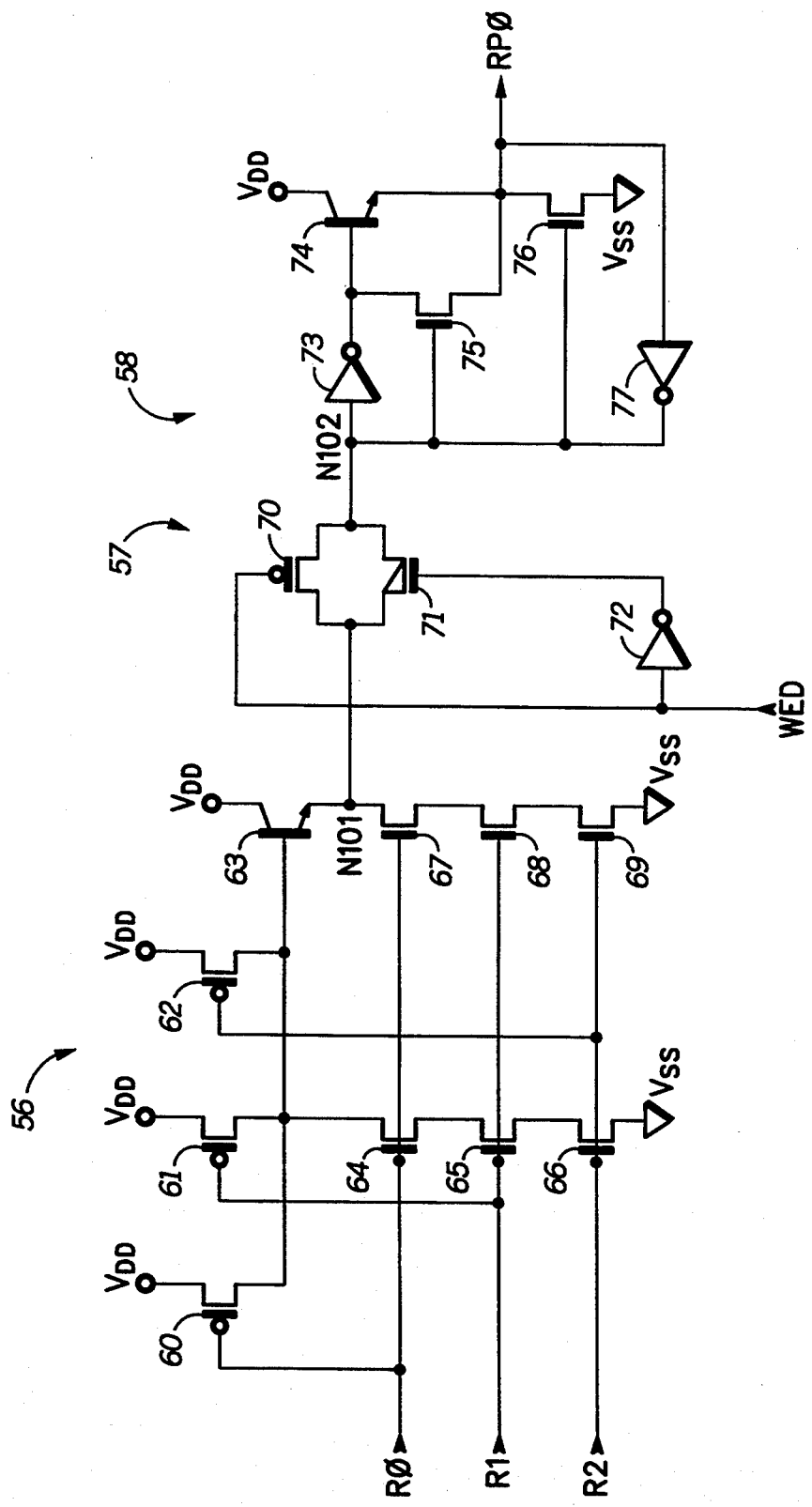
FIG. 4 illustrates in partial block diagram form and partial schematic form a portion of the row predecoder of FIG. 3 in accordance with the present invention.

FIG. 4 illustrates in partial block diagram form and partial schematic form, a row predecoder portion 42a of row predecoder 42 of FIG. 3 in accordance with the present invention. Row predecoder 42 includes a plurality of row predecoder circuits represented by row predecoder 42a of FIG. 4. In one embodiment, seven differential address signals are provided by address buffer 40 to row predecoder 42. Twenty-four row predecoder 42a circuit portions in row predecoder 42 receive these seven differential address signals and provide 24 predecoded row address signals.

Row predecoder 42a includes three input NAND gate 56, pass gate 57, and latch portion 58. NAND gate 56 includes P-channel transistors 60, 61, and 62, N-channel transistors 64, 65, 66, 67, 68, and 69, and NPN transistor 63. P-channel transistor 60 has a source connected to a positive power supply voltage terminal labeled "$V_{DD}$", a gate for receiving an input signal labeled "R0", and a drain. P-channel transistor 61 has a source connected to $V_{DD}$, a gate for receiving an input signal labeled "R1", and a drain connected to the drain of transistor 60. P-channel transistor 62 has a source connected to $V_{DD}$, a gate for receiving an input signal labeled "R2", and a drain connected to the drain of transistor 61. NPN transistor 63 has a collector connected to $V_{DD}$, a base connected to the drain of transistor 62, and an emitter connected to a node labeled "N101". N-channel transistor 64 has a drain connected to the drains of transistors 60, 61, and 62, a gate connected to the gate of transistor 60, and a source. N-channel transistor 65 has a drain connected to the source of transistor 64, a gate connected to the gate of transistor 61, and a source. N-channel transistor 66 has a drain connected to the source of transistor 65, a gate connected to the gate of transistor 62, and a source connected to a negative power supply voltage terminal labeled "$V_{SS}$". N-Channel transistor 67 has a drain connected to the emitter of transistor 63 at node N101, a gate connected to the gate of transistor 64, and a source. N-channel transistor 68 has a drain connected to the source of transistor 67, a gate connected to the gate of transistor 65, and a source. N-channel transistor 69 has a drain connected to the source of transistor 68, a gate connected to the gate of transistor 66, and a source connected to $V_{SS}$.

Pass gate 57 includes P-channel transistor 70, N-channel transistor 71, and inverter 72. P-channel transistor 70 has a first drain/source terminal connected to the emitter of transistor 63 at node N101, a second drain/source terminal connected to a node labeled "N102", and a gate for receiving single-sided control signal WED. N-channel transistor 71 has a first drain/source terminal connected to the first drain/source terminal of transistor 70 at node N101, a second drain/source terminal connected to the second drain/source terminal of transistor 70 at node N102, and a gate. Inverter 72 has an input terminal connected to the gate of transistor 70 and an output terminal connected to the gate of transistor 71.

Latch portion 58 includes inverters 73 and 77, NPN transistor 74, and N-channel transistor 75 and 76. Inverter 73 has an input terminal connected to the second drain/source terminal of transistor 70 at node N102 and an output terminal. NPN transistor 74 has a collector connected to $V_{DD}$, a base connected to the output terminal of inverter 73, and an emitter for providing an output signal labeled "RPO". N-channel transistor 75 has a drain connected to the base of transistor 74, a gate connected to the input terminal of inverter 73 at node N102, and a source connected to the emitter of transistor 74. N-channel transistor 76 has a drain connected to the emitter of transistor 74, a gate connected to the input terminal of inverter 73 at node N102, and a source connected to $V_{SS}$. Inverter 77 has an input terminal connected to the emitter of transistor 74 and an output terminal connected to the input terminal of inverter 73 at node N102.

Row predecoder portion 42a receives three input signals R0, R1, and R2, and provides output signal RPO to row select 38. Row predecoder 42a is representative of the plurality of row predecoders in memory 20. The number of row predecoders in memory 20 is determined by the number of row address signals and the number of rows in each memory block 22. Input signals R0, R1, and R2 represent three of the buffered address signals provided by address buffer 40, and output signal RPO represents one of the predecoded row address signals provided by row predecoder 42.

NAND gate 56 is a conventional BICMOS NAND gate and receives three CMOS level input signals R0, R1, and R2, which correspond to three of buffered row address signals ROW ADDRESS, and in response provides a signal at node N101 as a logical NAND of input signals R0, R1, and R2. When at least one of input signals R0, R1, and R2 is a logic low input to NAND gate 56, the signal at node N101 is a logic high. Only if all of input signals R0, R1, and R2 are a logic high will the signal at node N101 be a logic low. Input signals R0, R1, and R2 are at CMOS logic levels, however, a NAND gate using different logic levels (such as ECL) may be used.

For ECL (emitter-coupled logic) applications, $V_{DD}$ is the system ground with $V_{SS}$ equal to a negative power supply voltage, generally equal to −5.2 volts. An ECL logic high voltage is equal to substantially $V_{DD}$ minus one base-emitter diode voltage drop ($V_{BE}$), and an ECL logic low voltage is equal to $V_{DD} - 2V_{BE}$.

For the case in which one of signals R0, R1, and R2 is a logic low and the other signals are logic high voltages, at least one of P-channel transistors 60–62 is conductive, at least one of series connected N-channel transistors 64–66 is non-conductive, and at least one of series connected transistors 67–69 is non-conductive. Therefore, the base of transistor 63 is pulled to approximately $V_{DD}$, and the logic high voltage at node N101 is equal to the voltage at the base of transistor 63 minus one base-emitter diode voltage drop ($V_{BE}$) across transistor 63. When all of input signals R0, R1, and R2 are logic high voltages, all of P-channel transistors 60–62 are non-conductive and all of N-channel transistors 64–66 are conductive, thus pulling the base of transistor 63 to $V_{SS}$. Transistor 63 is non-conductive, so that the voltage at node N101 is pulled to a logic low voltage of approximately $V_{SS}$ through transistors 67–69.

When pass gate 57 receives single-sided delay control signal WED as a logic low, (indicating a read cycle), P-channel transistor 70 is conductive. Inverter 72 receives control signal WED as a logic low voltage and provides a logic high voltage to N-channel transistor 71, making transistor 71 conductive. When transistors 70 and 71 are switched on, (or conductive), there is a conductive path between nodes N101 and N102 making the voltage at node N102 approximately equal to the voltage at node N101. Latch portion 58 receives a signal through pass gate 57 at node N102 when single-sided delay control signal WED is a logic low, and provides output signal RPO.

When pass gate 57 receives single-sided delay control signal WED as a logic high voltage, (indicating a write cycle), P-channel transistor 70 and N-channel transistor 71 are switched off, (or non-conductive), preventing the voltage level at node N102 from being affected by the voltage at node N101. Latch portion 58 holds output signal RPO at a logic level corresponding to the logic level before single-sided delay control signal WED became a logic high. Latch portion 58 holds the logic level of output signal RPO until control signal WED becomes a logic low, thus causing a conductive path to form between nodes N101 and N102.

N-channel transistor 71 is shown as a low threshold N-channel transistor in the embodiment illustrated in FIG. 4, to decrease the switching delay of pass gate 57. Low threshold N-channel transistor 71 has a threshold voltage ($V_T$) of about 0.5 volts. In other embodiments, a normal N-channel transistor may be substituted for low threshold N-channel transistor 71.

If the voltage at node N102 is a logic high, the output of inverter 73 is a logic low and transistor 74 is switched off, (or non-conductive). Transistor 75 is conductive and helps to prevent base-emitter reverse bias of transistor 74. Transistor 76 is conductive, thus pulling the voltage at the emitter of transistor 74 to $V_{SS}$, so that output signal RPO is a logic low equal to approximately $V_{SS}$. Inverter 77 receives a logic low voltage and reinforces the logic high at node N102. Inverter 77 therefore "latches" the logic level of output signal RPO. Inverter 77 is sized to provide a weak latch so that the logic level maintained by latch portion 58 can be overwritten when pass gate 57 is conductive, allowing a new address signal to pass.

If the voltage at node N102 is a logic low, the output of inverter 73 is a logic high and transistor 74 is conductive. Both transistors 75 and 76 are non-conductive, allowing output signal RPO to be pulled to a logic high. The voltage received by inverter 77 is a logic high, so that a logic low output is provided to node N102 to provide a weak latch for the logic low voltage at node N102 that can be overwritten when pass gate 57 is conductive and allows a new signal to pass.

Figure 5:
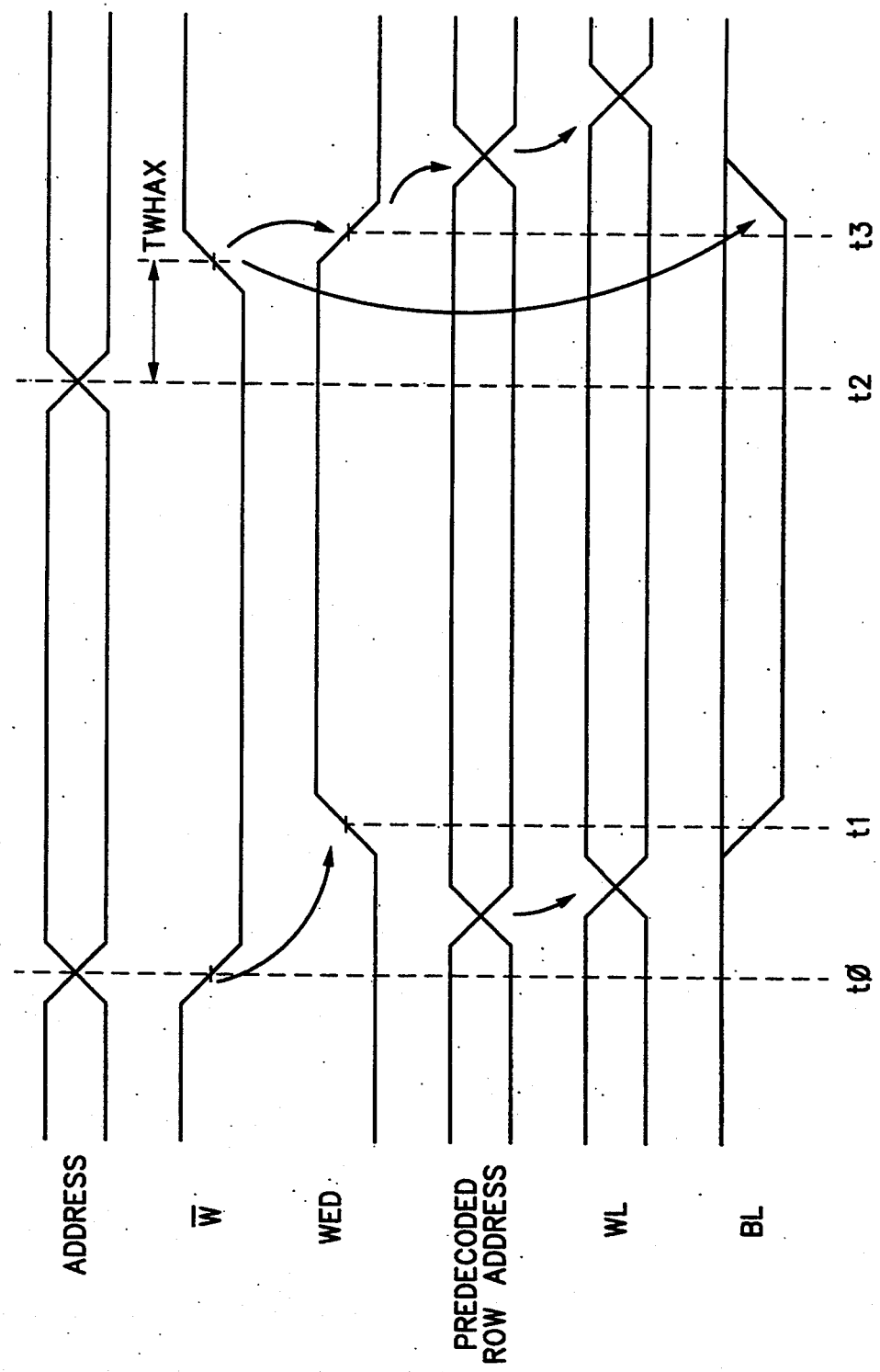
FIG. 5 shows a timing diagram of various signals of the memory of FIG. 3 in accordance with the present invention.

FIG. 5 shows a timing diagram of some of the various signals of memory 20 of FIG. 3. Note that the time intervals and logic levels illustrated in FIG. 5 are not drawn to scale and are only intended to represent the sequence and relationship of some of the signals during a write cycle of memory 20. At time t0, the address changes and write enable signal $\overline{W}$ changes from a logic high to a logic low, thus indicating the start of a write cycle. Note that in other embodiments, write enable signal $\overline{W}$ may become a logic low at some time after time t0. In response to the address changing, the predecoded row address changes after a relatively short propagation delay. Also, the word line (WL) changes in response to, and after the predecoded row address changes. Single-sided delay control signal WED changes from a logic low to a logic high at time t1, after a predetermined delay, in response to write enable signal $\overline{W}$ changing from a logic high to a logic low. At time t1, single-sided delay control signal WED causes the predecoded row address to be latched. The length of the predetermined delay is long enough to ensure that there is a valid predecoded row address before the predecoded row address is latched.

The time interval between the address changing at time t2 and write enable signal $\overline{W}$ becoming a logic high is known as the TWHAX specification. Normally write enable signal $\overline{W}$ becomes inactive at the same time as, or before the address changes, in which case TWHAX is zero. In the case illustrated by FIG. 5, TWHAX is negative, i.e., write enable signal $\overline{W}$ becomes inactive after the address changes. If this occurs, bit line equalization may not be concluded before the address changes, causing data to be written onto the memory cell selected by the new word line, thus destroying the data. In the preferred embodiment, the row address is latched in row predecoder 42. This prevents the word line (WL) from changing until after time t3, when single-sided delay control signal WED transitions to a logic low. This ensures that bit line (BL) equalization always occurs before the word line changes.

Figure 6:
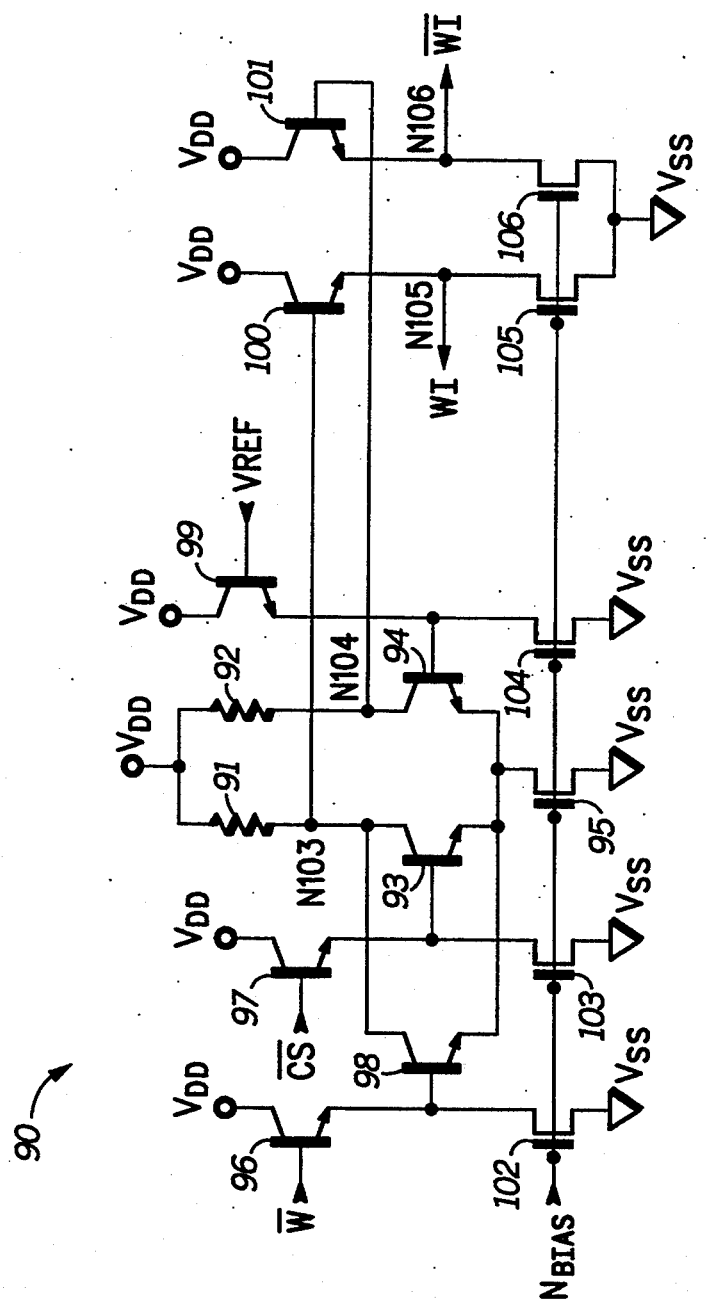
FIG. 6 illustrates in partial block diagram form and partial schematic form a portion of the write control circuit of the memory of FIG. 3 in accordance with the present invention.

FIG. 6 illustrates in partial schematic diagram form and partial block diagram form ECL logic gate 90 of write control circuit 44 of memory 20 of FIG. 3 in accordance with the present invention. Additional circuitry is included in write control circuit 44 to provide internal core write signal $\overline{WIC}$ and internal chip select signal $\overline{CSI}$, but is not shown in FIG. 6. ECL logic gate 90 is a conventional ECL logic gate and includes resistors 91 and 92, NPN transistors 93, 94, and 96–101, and N-channel transistors 95 and 102–106. Resistors 91 and 92 and transistors 93, 94, and 95 form a conventional differential amplifier. Resistor 91 has a first terminal connected to a positive power supply voltage terminal labeled "$V_{DD}$" and a second terminal connected to a node labeled "N103". Resistor 92 has a first terminal connected to $V_{DD}$ and a second terminal connected to a node labeled "N104". NPN transistor 93 has a collector connected to the second terminal of resistor 91 at node N103, a base, and an emitter. NPN transistor 94 has a collector connected to the second terminal of resistor 92 at node N104, a base, and an emitter connected to the emitter of transistor 93. N-channel transistor 95 has a drain connected to the emitters of transistors 93 and 94, a gate for receiving a bias voltage labeled "$N_{BIAS}$", and a source connected to a negative power supply voltage terminal labeled "$V_{SS}$". NPN transistor 96 has a collector connected to $V_{DD}$, a base for receiving external write enable signal $\overline{W}$, and an emitter. NPN transistor 97 has a collector connected to $V_{DD}$, a base for receiving external chip select signal $\overline{CS}$, and an emitter connected to the base of transistor 93. N-channel transistor 102 has a drain connected to the emitter of transistor 96, a gate for receiving $N_{BIAS}$, and a source connected to $V_{SS}$. NPN transistor 98 has a collector connected to the second terminal of resistor 91 at node N103, a base connected to the emitter of transistor 96, and an emitter connected to the emitters of transistors 93 and 94. N-channel transistor 103 has a drain connected to the emitter of transistor 97, a gate for receiving bias voltage $N_{BIAS}$, and a source connected to $V_{SS}$. NPN transistor 99 has a collector connected to $V_{DD}$, a base for receiving a reference voltage labeled "VREF", and an emitter connected to the base of transistor 94. N-channel transistor 104 has a drain connected to the emitter of transistor 99, a gate for receiving bias voltage $N_{BIAS}$, and a source connected to $V_{SS}$. NPN transistor 100 has a collector connected to $V_{DD}$, a base connected to the collector of transistor 93 at node N103, and an emitter connected to a node labeled "N105" for providing an internal write signal labeled "WI". N-channel transistor 105 has a drain connected to the emitter of transistor 100 at node N105, a gate for receiving bias voltage $N_{BIAS}$, and a source connected to $V_{SS}$. NPN transistor 101 has a collector connected to $V_{DD}$, a base connected to the collector of transistor 94 at node N104, and an emitter connected to a node labeled "N106" for providing an internal write signal labeled "$\overline{WI}$". N-channel transistor 106 has a drain connected to the emitter of transistor 101 at node N106, a gate for receiving bias voltage NBIAS, and a source connected to $V_{SS}$. The operation of ECL logic gate 90 will be described later in the discussion of FIG. 7.

FIG. 7 illustrates in schematic diagram form single-sided delay circuit 45 in accordance with a preferred embodiment of the present invention. Single-sided delay circuit 45 includes level converter 123, low power level converter 121, delay stage 128, and BICMOS output stage 145. Level converter 123 includes P-channel transistors 124 and 125 and N-channel transistors 126 and 127. P-channel transistor 124 has a source connected to $V_{DD}$, a gate for receiving internal signal WI, and a drain. P-channel transistor 125 has a source connected to $V_{DD}$, a gate for receiving internal signal $\overline{WI}$, and a source. N-channel transistor 126 has a drain and a gate connected to the drain of transistor 124, and a source connected to $V_{SS}$. N-channel transistor 127 has a drain connected to the drain of transistor 125, a gate connected to the drain of transistor 124, and a source connected to $V_{SS}$.

Delay stage 128 includes inverters 129–135, P-channel transistors 136 and 137, and N-channel transistors 138 and 139. Transistors 136–139 form NOR gate 122. Inverters 129–135 are a chain of inverters, and are connected in series with the input terminal of inverter 129 connected to the drain of transistor 125. The output of inverter 129 is connected to the input of inverter 130, and so forth. P-channel transistor 136 has a source connected to $V_{DD}$, a gate connected to the gate of transistor 125 and for receiving internal write signal $\overline{WI}$, and a drain. P-channel transistor 137 has a source connected to the drain of transistor 136, a gate connected to the output of inverter 135, and a drain. N-channel transistor 138 has a drain connected to the drain of transistor 137, a gate connected to the drain of transistor 124, and a source connected to $V_{SS}$. N-channel transistor 139 has a drain connected to the drain of transistor 137, a gate connected to the gate of transistor 137, and a source connected to $V_{SS}$.

Low power level converter 121 includes P-channel transistors 141, 142, and 145 and N-channel transistors 143, 144, and 146. P-channel transistor 145 has a source connected to $V_{DD}$, a gate for receiving single-sided delay control signal WED, and a drain. P-channel transistor 141 has a source connected to the drain of transistor 145, a gate for receiving internal write signal $\overline{WI}$, and a drain. P-channel transistor 142 has a source connected to $V_{DD}$, a gate for receiving internal write signal WI, and a drain. N-channel transistor 143 has a drain and a gate connected to the drain of transistor 141, and a source connected to $V_{SS}$. N-channel transistor 144 has a drain connected to the drain of transistor 142, a gate connected to the drain of transistor 141, and a source connected to $V_{SS}$. N-channel transistor 146 has a first drain/source terminal connected to the drain of transistor 141, a gate connected to the gate of transistor 145 for receiving control signal WED, and second drain-/source terminal connected to the drain of transistor 142.

BICMOS output stage 145 includes NPN transistors 140 and 147, P-channel transistor 148, and N-channel transistors 149 and 150. NPN transistor 140 has a collector connected to $V_{DD}$, a base connected to the drain of transistor 137, and an emitter for providing single-sided delay control signal WED. NPN transistor 147 has a collector connected to the emitter of transistor 140, a base, and an emitter connected to $V_{SS}$. P-channel transistor 148 has a source connected to the base of transistor 140, a gate connected to $V_{SS}$, and a drain connected to the emitter of transistor 140. N-channel transistor 149 has a drain connected to the emitter of transistor 140, a gate connected to the drain of transistor 142, and a source connected to the base of transistor 147. N-channel transistor 150 has a drain connected to the base of transistor 147, a gate connected to $V_{DD}$, and a source connected to $V_{SS}$.

Referring again to ECL logic gate 90 of FIG. 6, transistors 96 and 102 form an emitter-follower input circuit which drops the voltage received at the base of transistor 98 to one $V_{BE}$ (approximately 0.8 volts) below the voltage of write enable signal $\overline{W}$. Transistors 97 and 103 form another emitter-follower input circuit which drops the voltage received at the base of transistor 93 to one $V_{BE}$ below chip enable signal $\overline{CS}$. A differential amplifier is formed by resistors 91 and 92, transistors 93 and 94, and transistor 95. A reference voltage VREF is received at the base of transistor 99 which drops reference voltage VREF one $V_{BE}$ before it is provided to the base of transistor 94. The collector of transistor 93 provides a logical NOR output signal at node N103 of signals $\overline{W}$ and $\overline{CS}$. The collector of transistor 94 provides a logical OR output signal at node N104 of signals $\overline{W}$ and $\overline{CS}$. Reference voltage VREF is chosen so the voltage received by the base of transistor 94 is at the midpoint of the logic swings of signals $\overline{W}$ and $\overline{CS}$. Transistors 100 and 105 form an emitter-follower output portion which is connected to the collector of transistor 93 at node N103. Transistors 101 and 106 form an emitter-follower output portion which is connected to the collector of transistor 94 at node N104. Internal write signals WI and $\overline{WI}$ are complementary internal logic signals and are provided at intermediate, or analog, logic levels. An intermediate level logic high is equal to approximately −0.8 volts and an intermediate level logic low is equal to approximately −2.4 volts when $V_{DD}$ is equal to zero volts and $V_{SS}$ is equal to about −5.2 volts.

During a read cycle of memory 20, ECL logic gate 90 receives ECL level write enable signal $\overline{W}$ as a logic high and chip select signal $\overline{CS}$ as a logic low. Transistor 93 is non-conductive and transistor 98 is conductive. A current through transistor 95, designated as $I_{95}$, is steered through transistor 98 so that the voltage at node N103 is equal to a logic low voltage of $V_{DD}$ minus $I_{95}R_{91}$, where $R_{91}$ is the resistance of resistor 91. The voltage at node N104 is a logic high, approximately equal to $V_{DD}$. Internal write signal WI is a logic low voltage equal to the voltage at node N103 minus one $V_{BE}$ across transistor 100, and internal signal $\overline{WI}$ is a logic high voltage equal to the voltage at node N104 minus one $V_{BE}$ across transistor 101.

Single-sided delay circuit 45 provides single-sided delay control signal WED at a CMOS level logic high voltage in response to signals $\overline{W}$ and $\overline{CS}$ both being at ECL logic low voltages (indicating a write cycle). When write enable signal $\overline{W}$ is an ECL logic high voltage and chip select signal $\overline{CS}$ is a ECL logic low voltage (indicating a read cycle), single-sided delay control signal WED is provided at a CMOS level logic low voltage. When write enable signal $\overline{W}$ transitions from a logic high to a logic low voltage, single-sided delay control signal WED transitions from a logic low to a logic high after a built-in delay provided by delay stage 128. When write enable signal $\overline{W}$ transitions from a logic low to a logic high voltage, single-sided delay control signal WED transitions from a logic high voltage to a logic low voltage without a delay being provided by delay stage 128.

Figure 1:
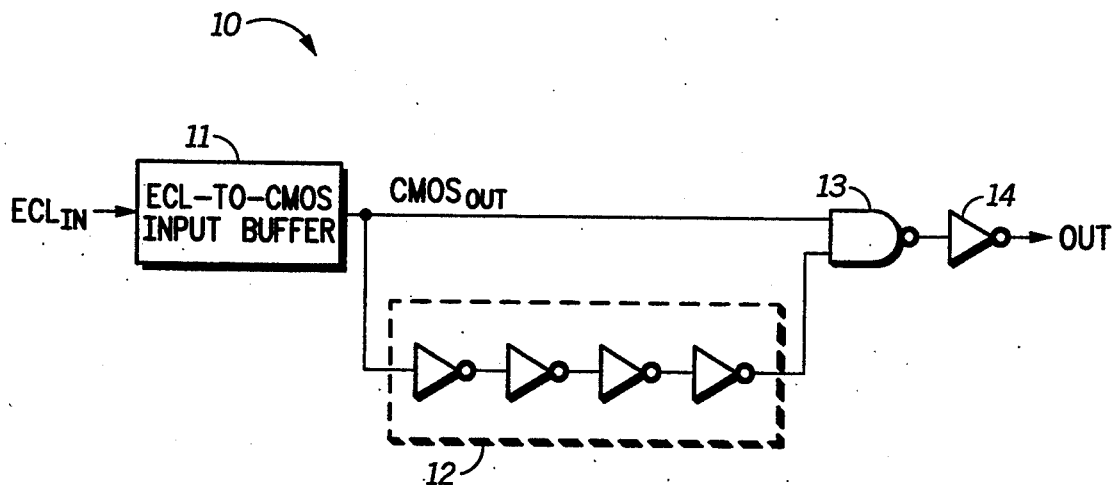
FIG. 1 illustrates in block diagram form a prior art ECL-to-CMOS converter with a single-sided delay.
Figure 2:
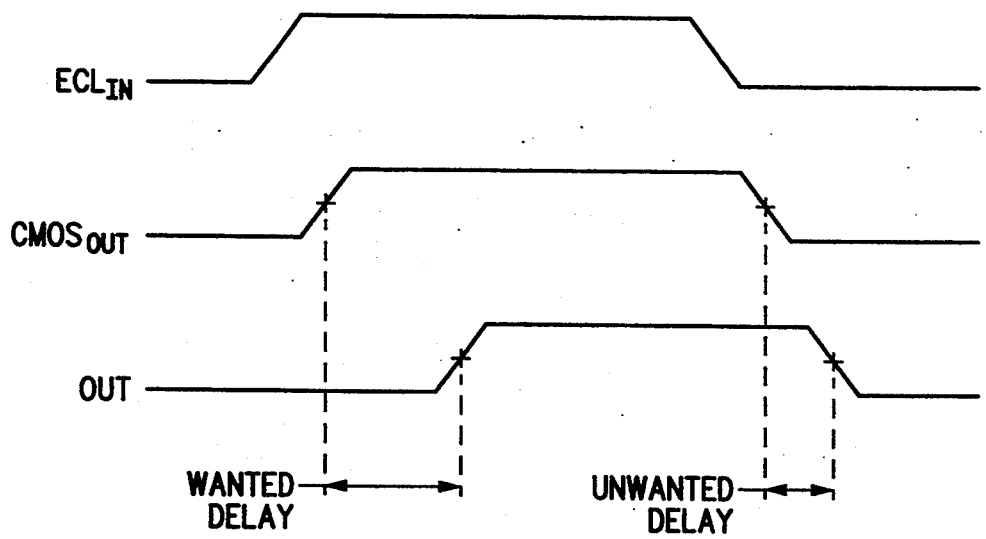
FIG. 2 illustrates a timing diagram of the some of the signals at selected points of the prior art ECL-to-CMOS converter of FIG. 1.

A benefit of having delay stage 128 incorporated between level converter 123 and output stage 145 is that power consumption of single-sided delay 45 remains low. This is because CMOS logic stages are used in delay stage 128. Switching times are improved because intermediate logic levels from ECL logic gate 90 are used in the transition from a high logic level to a low logic level, instead of full-rail CMOS logic levels. In addition, the unwanted delay illustrated in the prior art timing diagram of FIG. 2 is reduced because there is not an additional logic gate for the signal to propagate through when single-sided delay control signal WED transitions from a logic high to a logic low.

During a read cycle, (write enable signal $\overline{W}$ is an ECL logic high), internal write signal WI is an intermediate level logic low and internal write signal $\overline{WI}$ is an intermediate level logic high. In level converter 123, transistor 124 is conductive and transistor 125 is non-conductive. Transistor 126 is conductive so that a current flows through transistors 124 and 126 between $V_{DD}$ and $V_{SS}$. Transistor 127 is conductive, thus pulling the voltage at the input of inverter 129 to a logic low voltage equal to approximately $V_{SS}$. A logic low at the input of inverter 129 causes the output of inverter 135 to be a logic high voltage equal to approximately $V_{DD}$. Inverters 127–135 operate at full rail CMOS logic levels. Transistors 136 and 137 are non-conductive, transistor 138 is conductive, thus pulling the base of bipolar pull-up transistor 140 to $V_{SS}$, causing transistor 140 to be non-conductive. Single-sided delay control signal WED is therefore provided at the emitter of transistor 140 as a logic low.

At the same time, low power level converter 121 receives internal write signals WI and $\overline{WI}$ at the gates of transistors 142 and 141, respectively. Transistor 142 is conductive and transistor 141 is non-conductive. Transistors 143 and 144 are non-conductive, preventing any current flow between the power supply voltage terminals $V_{DD}$ and $V_{SS}$. Transistor 145 receives a logic low control signal WED and is conductive. Transistor 146 is therefore non-conductive. Transistors 149 and 150 are conductive, causing bipolar transistor 147 to be conductive, thus pulling single-sided delay control signal WED to a logic low.

To begin a write cycle of memory 20, both of signals $\overline{W}$ and $\overline{CS}$ are changed to logic low voltages. Therefore, transistors 93 and 98 are non-conductive, and transistor 94 is conductive, so that current $I_{95}$ is steered through transistor 94. The voltage at node N103 is a logic high voltage equal to approximately $V_{DD}$, and the voltage at node N104 is a logic low voltage equal to approximately $V_{DD}$ minus $I_{95}R_{92}$, where $R_{92}$ represents the resistance of resistor 92. Internal write signal WI is a logic high voltage equal to the voltage at node N103 minus one VBE across transistor 100, and internal write signal $\overline{WI}$ is a logic low voltage equal to the voltage at node N104 minus one $V_{BE}$ across transistor 101.

Transistor 124 is non-conductive and transistor 125 is conductive. Transistors 126 and 127 are both non-conductive so that there is no DC current flowing through level converter 123. Since transistor 124 is non-conductive, transistor 138 is also non-conductive. A logic high voltage approximately equal to $V_{DD}$ is provided to the input of inverter 129, thus a logic low voltage is provided by the output of inverter 135. Transistor 136 receives $\overline{WI}$ at an intermediate logic low that is just low enough to make transistor 136 conductive and transistor 137 is delayed becoming conductive for the time it takes for the outputs of the inverter chain comprising inverters 129–135 to change states. A conductive path is created between $V_{DD}$ and the base of transistor 140 when both transistors 136 and 137 become conductive, causing bipolar transistor 140 to be biased into conduction. Transistor 141 of low power level converter 121 is conductive and transistor 142 is non-conductive. Since control signal WED is a logic high, transistor 146 is conductive, causing transistors 143 and 144 to be conductive. The gate of transistor 149 is pulled to approximately $V_{SS}$, making transistor 149 substantially non-conductive. Transistor 145 is non-conductive, preventing a conductive path from being created between $V_{DD}$ and $V_{SS}$. Therefore, no DC current is allowed to flow in low power level converter 121. Since transistor 149 is non-conductive, bipolar transistor 147 is also non-conductive, allowing control signal WED to be pulled to approximately $V_{DD}$. Series connected CMOS inverters 127–135 delay transistor 137 from becoming conductive for approximately 4 nanoseconds. The length of the delay can be easily controlled by increasing or decreasing the number of inverters in the inverter chain.

When transitioning from a write cycle to a read cycle, control signal WED transitions from a logic high to a logic low in response to write enable signal $\overline{W}$ transitioning from a logic low to a logic high. No delay is wanted when single-sided delay control signal WED transitions from a logic high to a logic low. Going into a read cycle, transistor 136 becomes non-conductive immediately and transistor 138 becomes conductive immediately, thus pulling the base of transistor 140 to $V_{SS}$. Transistor 140 becomes non-conductive, and output stage 145 reduces the voltage of single-sided delay control signal WED to a logic low voltage. Intermediate logic levels from ECL logic gate 90 are used so that transistor 136 can become conductive, and transistor 138 can become non-conductive, very quickly. Transistors 136–139 are connected to form CMOS two-input NOR gate 122. NOR gate 122 can operate at the intermediate logic level of signals WI and $\overline{WI}$. NOR gate 122 functions like a conventional NOR gate, except that the gate of transistor 138 is connected to the gates of transistors 126 and 127. If NOR gate 122 were a conventional NOR gate, the gate of transistor 138 would be connected to the gate of transistor 136. When internal write signal $\overline{WI}$ is a logic low, P-channel transistor 136 will become conductive, but the logic low of internal write signal $\overline{WI}$ is not low enough to make an N-channel transistor non-conductive. Therefore, the gate of transistor 138 is coupled to the gates of transistors 126 and 127, so that a voltage is provided to the gate of transistor 138 that will make transistor 138 non-conductive when transistor 136 is conductive, yet not induce a speed penalty.

Level converters 123 and 121 are interchangeable in most applications, however a draw back of low power level converter 121 is that it requires more area on the integrated circuit. In the preferred embodiment, low power level converter 121 is used as the pull-down level converter with a conventional level converter 123 as the pull-up level converter to reduce the power consumption of single-sided delay circuit 45, yet still be somewhat space efficient. In other embodiments, two low power level converters 121 can be used, further reducing the power consumption of single-sided delay circuit 45.

Figure 8:
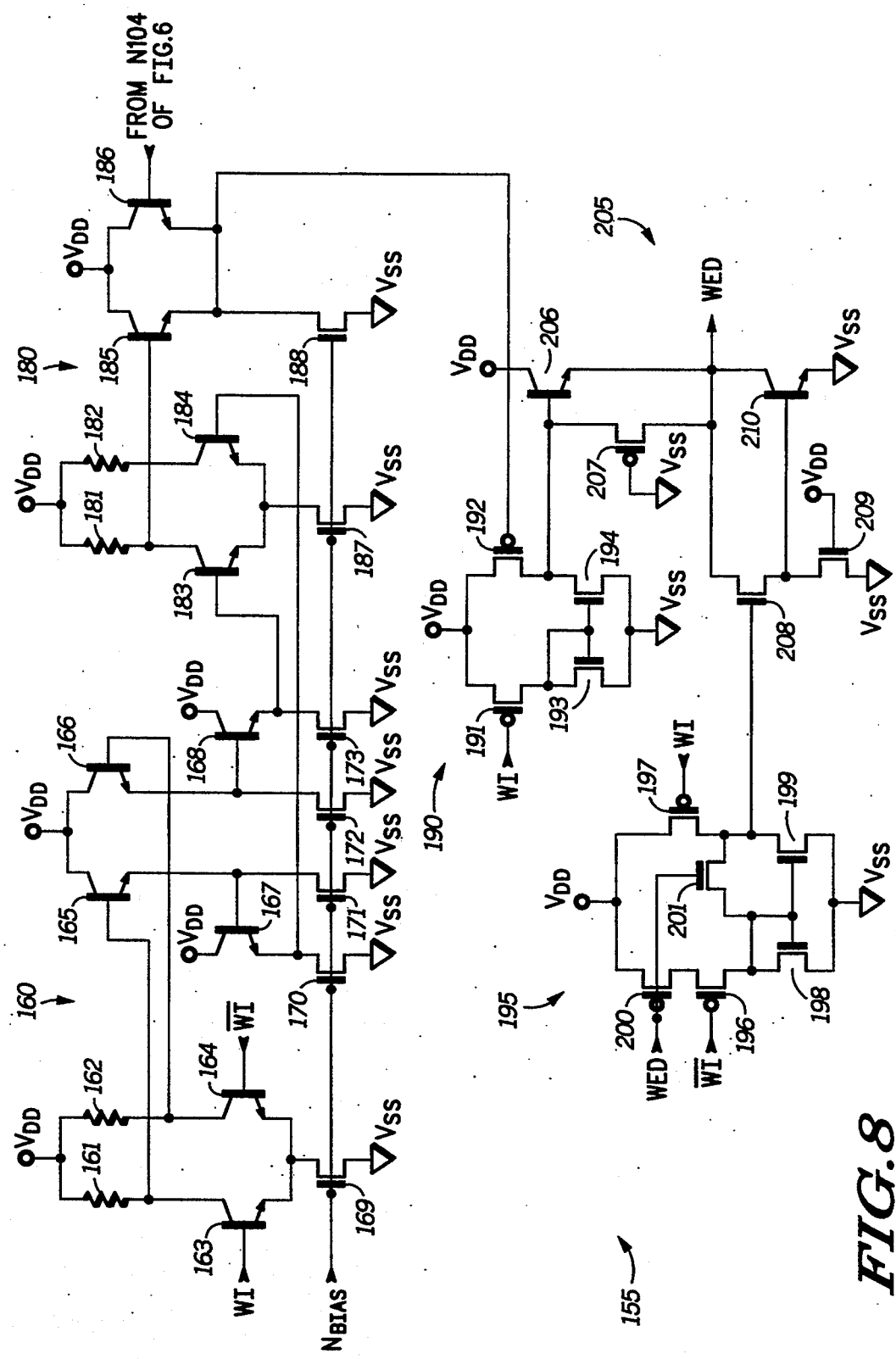
FIG. 8 illustrates in schematic form a second embodiment of invention.

FIG. 8 illustrates in schematic form single-sided delay circuit 155 in accordance with another embodiment of the present invention. Single-sided delay circuit 155 includes ECL delay stage 160, ECL wired-OR circuit 180, level converter 190, low power level converter 195, and BICMOS output stage 205. Level converter 190 is identical in operation to level converter 123 illustrated in FIG. 7. Low power level converter 195 is identical in operation to level converter 121 illustrated in FIG. 7. BICMOS output stage 205 is identical in operation to BICMOS output stage 145 illustrated in FIG. 7.

ECL delay stage 160 includes resistors 161 and 162, NPN transistors 163–168, and N-channel transistors 169–173. Resistors 161 and 162 and transistors 163, 164, and 169 form a conventional differential amplifier. Resistor 161 has a first terminal connected to $V_{DD}$, and a second terminal. Resistor 162 has a first terminal connected to $V_{DD}$, and a second terminal. NPN transistor 163 has a collector connected to the second terminal of resistor 161, a base for receiving internal write signal WI, and an emitter. NPN transistor 164 has a collector connected to the second terminal of resistor 162, a base for receiving internal write signal $\overline{WI}$, and an emitter connected to the emitter of transistor 163. NPN transistor 165 has a collector connected to $V_{DD}$, a base connected to the second terminal of resistor 161, and an emitter. NPN transistor 166 has a collector connected to $V_{DD}$, a base connected to the second terminal of resistor 162, and an emitter. NPN transistor 167 has a collector connected to $V_{DD}$, a base connected to the emitter of transistor 165, and an emitter. NPN transistor 168 has a collector connected to $V_{DD}$, a base connected to the emitter of transistor 166, and an emitter. N-channel transistor 169 has a drain connected to the emitters of transistors 163 and 164, a gate for receiving bias voltage $N_{BIAS}$, and a source connected to $V_{SS}$. N-channel transistor 170 has a drain connected to the emitter of transistor 167, a gate for receiving bias voltage $N_{BIAS}$, and a source connected to $V_{SS}$. N-channel transistor 171 has a drain connected to the emitter of transistor 165, a gate for receiving bias voltage $N_{BIAS}$, and a source connected to $V_{SS}$. N-channel transistor 172 has a drain connected to the emitter of transistor 166, a gate for receiving bias voltage $N_{BIAS}$, and a source connected to $V_{SS}$. N-channel transistor 173 has a drain connected to the emitter of transistor 168, a gate for receiving bias voltage $N_{BIAS}$, and a source connected to $V_{SS}$.

ECL wired-OR circuit 180 includes resistors 181 and 182, NPN transistor 183–186, and N-channel transistors 187 and 188. Resistor 181 has a first terminal connected to $V_{DD}$, and a second terminal. Resistor 182 has a first terminal connected to $V_{DD}$, and a second terminal. NPN transistor 183 has a collector connected to the second terminal of resistor 181, a base connected to the emitter of transistor 168, and an emitter. NPN transistor 184 has a collector connected to the second terminal of resistor 182, a base connected to the emitter of transistor 167 and an emitter connected to the emitter of transistor 183. NPN transistor 185 has a collector connected to $V_{DD}$, a base connected to the second terminal of resistor 181, and an emitter. NPN transistor 186 has a collector connected to $V_{DD}$, a base connected to node N104 of ECL logic gate 90 of FIG. 6, and an emitter connected to the emitter of transistor 185.

Level converter 190 includes P-channel transistors 191 and 192 and N-channel transistors 193 and 194. P-channel transistor 191 has a source connected to $V_{DD}$, a gate for receiving internal write signal WI, and a drain. P-channel transistor 192 has a source connected to $V_{DD}$, a gate connected to the emitter of transistors 185 and 186, and a source. N-channel transistor 193 has a drain and a gate connected to the drain of transistor 191, and a source connected to $V_{SS}$. N-channel transistor 194 has a drain connected to the drain of transistor 192, a gate connected to the drain of transistor 191, and a source connected to $V_{SS}$.

Low power level converter 195 includes P-channel transistors 196, 197, and 200 and N-channel transistors 198, 199, and 201. P-channel transistor 200 has a source connected to $V_{DD}$, a gate for receiving single-sided delay control signal WED, and a drain. P-channel transistor 196 has a source connected to the drain of transistor 200, a gate for receiving internal write signal $\overline{WI}$, and a drain. P-channel transistor 197 has a source connected to $V_{DD}$, a gate for receiving internal write signal WI, and a drain. N-channel transistor 198 has a drain and a gate connected to the drain of transistor 196, and a source connected to $V_{SS}$. N-channel transistor 199 has a drain connected to the drain of transistor 197, a gate connected to the drain of transistor 196, and a source connected to $V_{SS}$. N-channel transistor 201 has a first drain/source terminal connected to the drain of transistor 196, a gate connected to the gate of transistor 200 for receiving single-sided delay control signal WED, and a second drain/source terminal connected to the drain of transistor 197.

BICMOS output stage 205 includes NPN transistors 206 and 210, P-channel transistors 207 and 209, and N-channel transistor 208. NPN transistor 206 has a collector connected to $V_{DD}$, a base connected to the drain of transistor 192, and an emitter for providing single-sided delay control signal WED. NPN transistor 210 has a collector connected to the emitter of transistor 206, a base, and an emitter connected to VsS. P-channel transistor 207 has a source connected to the base of transistor 206, a gate connected to $V_{SS}$, and a drain connected to the emitter of transistor 206. N-channel transistor 208 has a drain connected to the emitter of transistor 206, a gate connected to the drain of transistor 197, and a source connected to the base of transistor 210. N-channel transistor 209 has a drain connected to the base of transistor 210, a gate connected to $V_{DD}$, and a source connected to $V_{SS}$.

Single-sided delay circuit 155 provides single-sided delay control signal WED at a CMOS level logic high voltage in response to signals $\overline{W}$ and $\overline{CS}$ both being at ECL logic low voltages (indicating a write cycle). When write enable signal $\overline{W}$ is an ECL logic high voltage and chip select signal $\overline{CS}$ is a ECL logic low voltage (indicating a read cycle), single-sided delay control signal WED is provided at a CMOS level logic low voltage. When write enable signal $\overline{W}$ transitions from a logic high to a logic low voltage, single-sided delay control signal WED transitions from a logic low to a logic high after a predetermined delay provided by ECL delay stage 160. The delay can be increased or decreased by adjusting the number of ECL delay stages. When write enable signal $\overline{W}$ transitions from a logic low to a logic high voltage, single-sided delay control signal WED transitions from a logic high voltage to a logic low voltage without the predetermined delay and without a speed penalty on the high to low transition.

During a read cycle, internal write signals WI and $\overline{WI}$ are provided by ECL logic gate 90 of FIG. 6 as intermediate logic low and logic high voltages, respectively. The voltage at node N104 of ECL logic gate 90 is also provided to the base of transistor 186, causing transistor 186 to be conductive. Transistor 185 is also conductive when internal write signal WI is a logic low. P-channel transistor 192 of level converter 190 is non-conductive. The voltage at the base of bipolar transistor 206 is reduced to approximately $V_{SS}$, thus transistor 206 is non-conductive and single-sided delay control signal WED is provided as a CMOS logic low.

When transitioning from a read cycle to a write cycle, internal write signals WI and $\overline{WI}$ become logic high and logic low voltages, respectively. The voltage at node N104 of ECL logic gate 90 (FIG. 6) decreases, causing transistor 186 to become less conductive. Internal write signals WI and $\overline{WI}$ are received by ECL delay stage 160. A logic high internal write signal WI causes the emitter voltage of transistor 167 to increase, which in turn causes the emitter voltage of transistor 184 increase. Thus, the voltage at the base of transistor 185 is reduced, causing transistor 185 to become non-conductive after a predetermined delay. The predetermined delay is the time it takes the signals to propagate through ECL delay stage 160. When the emitter voltages of transistors 185 and 186 are reduced, the voltage at the gate of transistor 192 is reduced, causing P-channel transistor 192 to become conductive. The voltage at the base of transistor 206 is increased, biasing transistor 206 into conduction. Single-sided delay control signal WED then becomes a CMOS logic high.

Transistors 185 and 186 are wired-OR connected. Transistor 185 has a base connected to an output of a differential amplifier comprised of resistors 181 and 182 and transistors 183, 184, and 187. If either transistor 185 or transistor 186 is conductive, a voltage approximately equal to $V_{DD}$ minus one $V_{BE}$ is provided to P-channel transistor 192. When transitioning from a write cycle to a read cycle, single-sided delay control signal WED transitions from a logic high to a logic low without a predetermined delay and with reduced unwanted delay because the base of transistor 186 is connected to node N104 of ECL logic gate 90. Therefore, transistor 186 becomes conductive very quickly because there are no additional stages involved. Transistor 185 becomes conductive after a predetermined delay, but transistor 186 has already become conductive causing single-sided delay control signal WED to become a logic low. Therefore, the predetermined delay does not affect single-sided delay control signal WED becoming a logic low. When memory 20 transitions from a read cycle to a write cycle, single-sided delay control signal WED transitions from a logic low to a logic high after a predetermined delay, because both transistors 185 and 186 must become non-conductive before transistor 192 can become conductive.

Single-sided delay circuit 155 differs from single-sided delay circuit 45 of FIG. 7, because the delay occurs in the ECL portions of the circuit instead of between the level converters and the BICMOS output stage as illustrated in FIG. 7. ECL delay stage 160 provides the delay in the form of an ECL logic gate similar to ECL logic gate 90. Single-sided delay circuit 155 has a disadvantage of greater power consumption because additional DC current is consumed by the ECL delay stages. Also, single-sided delay circuit 155 is more sensitive to process variations and is more difficult to adjust for increased or decreased delay.

While the invention has been described in the context of a preferred embodiment, it will be apparent to those skilled in the art that the present invention may be modified in numerous ways and may assume many embodiments other than that specifically set out and described above. For example, other types of reference and bias voltage circuits may be substituted for those illustrated. Also, row address latching may be accomplished in a location other than the row predecoder. In addition, a different method for latching the predecoded row address signal may be used. The single-sided delay may also be implemented so that the predetermined delay occurs when single-sided delay control signal WED transitions from a logic low to a logic high. Accordingly, it is intended by the appended claims to cover all modifications of the invention which fall within the true spirit and scope of the invention.

We claim:

1. An ECL-to-CMOS buffer having a single-sided delay, comprising:
   an ECL logic gate for receiving an ECL level input signal, and in response providing first and second logic signals;
   level converter means, for receiving said first and second logic signals and for providing a first CMOS level signal;
   delay means, having an input terminal for receiving said first CMOS level signal and an output terminal for providing a second CMOS level signal a predetermined delay after receiving said first CMOS level signal; and
   a logic gate for receiving said second logic signal and said second CMOS level signal and for providing a CMOS level output signal.

2. The ECL-to-CMOS buffer having a single-sided delay of claim 1, wherein said delay means comprises a plurality of series connected inverters.

3. The ECL-to-CMOS buffer having a single-sided delay of claim 1, further comprising BICMOS output driver means, for receiving said CMOS level output signal, and for providing a single-sided delay control signal in response to said CMOS-level output signal.

4. The ECL-to-CMOS buffer having a single-sided delay of claim 1, wherein said level converter means comprises:
   a first P-channel transistor having a source coupled to a first power supply voltage terminal, a gate for receiving said first logic signal, and a drain;
   a second P-channel transistor having a source coupled to said first power supply voltage terminal, a gate for receiving said second logic signal, and a drain for providing said first CMOS level signal;
   a first N-channel transistor having a drain and a gate coupled to said drain of said first P-channel transistor, and a source coupled to a second power supply voltage terminal; and
   a second N-channel transistor having a drain coupled to the drain of said second P-channel transistor, a gate coupled to said gate of said first N-channel transistor, and a source coupled to said second power supply voltage terminal.

5. The ECL-to-CMOS buffer having a single-sided delay of claim 1, wherein said first and second logic signals are complementary logic signals.

6. An ECL-to-CMOS buffer having a single-sided delay, comprising:
   an ECL logic gate for receiving an ECL level input signal, and for providing first and second logic signals;
   a first P-channel transistor having a source coupled to a first power supply voltage terminal, a gate for receiving said first logic signal, and a drain;
   a second P-channel transistor having a source coupled to said first power supply voltage terminal, a gate for receiving said second logic signal, and a drain for providing a first CMOS level signal;
   a first N-channel transistor having a drain and a gate coupled to said drain of said first P-channel transistor, and a source coupled to a second power supply voltage terminal;
   a second N-channel transistor having a drain coupled to the drain of said second P-channel transistor, a gate coupled to said gate of said first N-channel transistor, and a source coupled to said second power supply voltage terminal;
   delay means, having an input terminal coupled to said drain of said second P-channel transistor for receiving said first CMOS level signal and an output terminal for providing a second CMOS level signal after a predetermined delay;
   a third P-channel transistor having a source coupled to said first power supply voltage terminal, a gate for receiving said second logic signal, and a drain;
   a fourth P-channel transistor having a source coupled to said drain of said third P-channel transistor, a gate coupled to said output terminal of said delay means for receiving said second CMOS level signal, and a drain for providing a CMOS level output signal;
   a third N-channel transistor having a drain coupled to said drain of said fourth P-channel transistor, a gate coupled to said drain of said first P-channel transistor, and a source coupled to said second power supply voltage terminal; and
   a fourth N-channel transistor having a drain coupled to said drain of said third N-channel transistor, a gate coupled to said gate of said fourth P-channel transistor, and a source coupled to said second power supply voltage terminal.

7. The ECL-to-CMOS buffer having a single-sided delay of claim 6, further comprising BICMOS output driver means, for receiving said CMOS level output signal, and for providing a single-sided delay control signal in response to said CMOS-level output signal.

8. The ECL-to-CMOS buffer having a single-sided delay of claim 6, wherein said delay means comprises a plurality of series coupled inverters.

9. The ECL-to-CMOS buffer having a single-sided delay of claim 6, wherein said first and second logic signals are complementary logic signals.

10. An ECL-to-CMOS buffer having a single-sided delay, comprising:
    a first ECL logic gate for receiving an ECL level input signal, and in response providing first and second logic signals;

delay means for receiving said first and second logic signals, and in response providing a single-sided delay signal; and level converter means for receiving said single-sided delay signal, and in response providing a CMOS level output signal.

11. The ECL-to-CMOS buffer having a single-sided delay of claim 10, wherein said first and second logic signals are complementary logic signals.

12. The ECL-to-CMOS buffer having a single-sided delay of claim 10, wherein said delay means comprises at least one of a second ECL logic gate.

13. The ECL-to-CMOS buffer having a single-sided delay of claim 12, wherein said second ECL logic gate further comprises:

a first resistor having a first terminal coupled to a first power supply voltage terminal and a second terminal;

a second resistor having a first terminal coupled to said first power supply voltage terminal and a second terminal;

a first bipolar transistor having a collector coupled to said second terminal of said first resistor, a base for receiving said first logic signal, and an emitter;

a second bipolar transistor having a collector coupled to said second terminal of said second resistor, a base for receiving said second logic signal, and an emitter coupled to said emitter of said first bipolar transistor;

a first FET transistor having a drain coupled to said emitter of said first bipolar transistor, a gate for receiving a bias voltage, and a source coupled to a second power supply voltage terminal;

a third bipolar transistor having a collector coupled to said first power supply voltage terminal, a base coupled to said collector of said first bipolar transistor, and an emitter;

a fourth bipolar transistor having a collector coupled to said first power supply voltage terminal, a base coupled to said collector of said second bipolar transistor, and an emitter;

a fifth bipolar transistor having a collector coupled to said first power supply voltage terminal, a base coupled to said emitter of said third bipolar transistor, and an emitter;

a sixth bipolar transistor having a collector coupled to said first power supply voltage terminal, a base coupled to said emitter of said fourth bipolar transistor, and an emitter;

a second FET transistor having a drain coupled to said emitter of said third bipolar transistor, a gate for receiving said bias voltage, and a source coupled to said second power supply voltage terminal;

a third FET transistor having a drain coupled to said emitter of said fourth bipolar transistor, a gate for receiving said bias voltage, and a source coupled to said second power supply voltage terminal;

a fourth FET transistor having a drain coupled to said emitter of said fifth bipolar transistor, a gate for receiving said bias voltage, and a source coupled to said second power supply voltage terminal; and a fifth FET transistor having a drain coupled to said emitter of said sixth bipolar transistor, a gate for receiving said bias voltage, and a source coupled to said second power supply voltage terminal.

14. The ECL-to-CMOS buffer having a single-sided delay of claim 13, further comprising:

a third resistor having a first terminal coupled to said first power supply voltage terminal and a second terminal;

a fourth resistor having a first terminal coupled to said first power supply voltage terminal and a second terminal;

a seventh bipolar transistor having a collector coupled to said second terminal of said third resistor, a base coupled to said emitter of said sixth bipolar transistor, and an emitter;

an eighth bipolar transistor having a collector coupled to said second terminal of said fourth resistor, a base coupled to said emitter of said fifth bipolar transistor, and an emitter coupled to said emitter of said seventh bipolar transistor;

a seventh FET transistor having a drain coupled to said emitter of said seventh bipolar transistor, a gate for receiving said bias voltage, and a source coupled to said second power supply voltage terminal;

a ninth bipolar transistor having a collector coupled to said first power supply voltage terminal, a base coupled to said collector of said seventh bipolar transistor, and an emitter;

a tenth bipolar transistor having a collector coupled to said first power supply voltage terminal, a base coupled to said first ECL logic gate, and an emitter coupled to said emitter of said ninth bipolar transistor; and an eighth FET transistor having a drain coupled to said emitter of said ninth bipolar transistor, a gate for receiving said bias voltage, and a source coupled to said second power supply voltage terminal.

* * * * *